(12) United States Patent
Kim

(10) Patent No.: US 8,212,278 B2
(45) Date of Patent: Jul. 3, 2012

(54) LIGHT EMITTING PACKAGE CONTROLLING COLOR TEMPERATURE, FABRICATING METHOD THEREOF, COLOR TEMPERATURE CONTROLLING METHOD OF LIGHT EMITTING PACKAGE

(75) Inventor: Yu-Sik Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 164 days.

(21) Appl. No.: 12/710,708

(22) Filed: Feb. 23, 2010

(65) Prior Publication Data

US 2010/0213498 A1 Aug. 26, 2010

(30) Foreign Application Priority Data

Feb. 26, 2009 (KR) .................. 10-2009-0016371

(51) Int. Cl.
*H01L 33/00* (2010.01)

(52) U.S. Cl. ............... 257/99; 257/79; 257/81; 257/84; 257/89

(58) Field of Classification Search ............ 257/106, 257/79, 80, 81, 84, 88, 89, 199, 481, 551, 257/594, 603, 624, 778, 666, 673, 676, 678, 257/690, 684, 723, 734, 99

See application file for complete search history.

(56) References Cited

U.S. PATENT DOCUMENTS

| 7,738,764 | B2 * | 6/2010 | Kim .................... 385/147 |
| 2006/0001030 | A1 * | 1/2006 | Okuwaki et al. ........... 257/79 |
| 2007/0228516 | A1 * | 10/2007 | Plank et al. ............. 257/531 |

FOREIGN PATENT DOCUMENTS

| JP | 2007-180430 | 7/2007 |
| JP | 2008-218485 | 9/2008 |
| KR | 1020060123682 | 12/2006 |

* cited by examiner

*Primary Examiner* — Ha Tran T Nguyen
*Assistant Examiner* — Thanh Y Tran
(74) *Attorney, Agent, or Firm* — F. Chau & Associates, LLC

(57) ABSTRACT

Provided are a light emitting package capable of controlling a color temperature, a fabricating method thereof, and a color temperature controlling method of the light emitting package. The light emitting package includes a package body, a first electrode and a second electrode formed on the package body and spaced apart from each other, a light emitting element formed on the package body and electrically connected to the first electrode and the second electrode, and a thin film resistor connected in series to the first electrode.

9 Claims, 17 Drawing Sheets

LIGHT EMITTING PACKAGE CONTROLLING COLOR TEMPERATURE, FABRICATING METHOD THEREOF, COLOR TEMPERATURE CONTROLLING METHOD OF LIGHT EMITTING PACKAGE

CROSS-REFERENCE TO RELATED APPLICATION

This application claims priority from Korean Patent Application No. 10-2009-0016371 filed on Feb. 26, 2009 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a light emitting package, a fabricating method thereof, and a color temperature controlling method of the light emitting package.

2. Description of the Related Art

Light emitting devices such as light emitting diodes (LEDs) emit light when electrons and holes are combined. The light emitting devices have several advantages including low power consumption, extended life span, being installable without spatial limitation, and robustness against vibration.

A light emitting package can generate light of various wavelengths, for example, blue light, UV light, white light, and so on.

For example, a white light emitting package capable of generating white light is fabricated in the following manner. The white light emitting package capable of generating a bluish white light can be fabricated by coating a yellow phosphor on a light emitting element that emits blue light. Alternatively, the white light emitting package capable of generating a reddish white light can also be fabricated by coating a yellow phosphor and a red phosphor on a light emitting element that emits blue light.

The white light emitting package fabricated in such a manner may have a considerably wide range of color temperatures. However, white light emitting packages do not fall under a predefined range of color temperatures are discarded.

SUMMARY

The present disclosure may provide a light emitting package which controls a color temperature.

The present disclosure may also provide a color temperature controlling method of the light emitting device.

The present disclosure may provide a fabricating method of the light emitting device.

The above and other objects of the present invention will be described in or be apparent from the following description of the preferred embodiments.

According to an aspect of the present invention, there is provided a light emitting package including a package body having a first surface and a second surface opposite the first surface, a first electrode and a second electrode formed on the package body and spaced apart from each other, a light emitting element formed on the package body and electrically connected to the first electrode and the second electrode, and a thin film resistor connected in series to the first electrode.

According to another aspect of the present invention, there is provided a color temperature controlling method of a light emitting package, the method including forming a light emitting package including a package body, a first electrode and a second electrode formed on the package body and spaced apart from each other, a light emitting element formed on the package body and electrically connected to the first electrode and the second electrode, and a thin film resistor series-connected to the first electrode, measuring a color temperature of the light emitting package, and controlling the color temperature of the light emitting package, for example, by laser-trimming the thin film resistor.

According to still another aspect of the present invention, there is provided a fabricating method of a light emitting package, including forming a thin film resistor on a substrate, forming a first electrode and a second electrode spaced apart from each other on the substrate, the first electrode being series-connected to the thin film resistor, and forming a light emitting element electrically connected to the first electrode and the second electrode on the substrate.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE EMBODIMENTS

Figure 1:
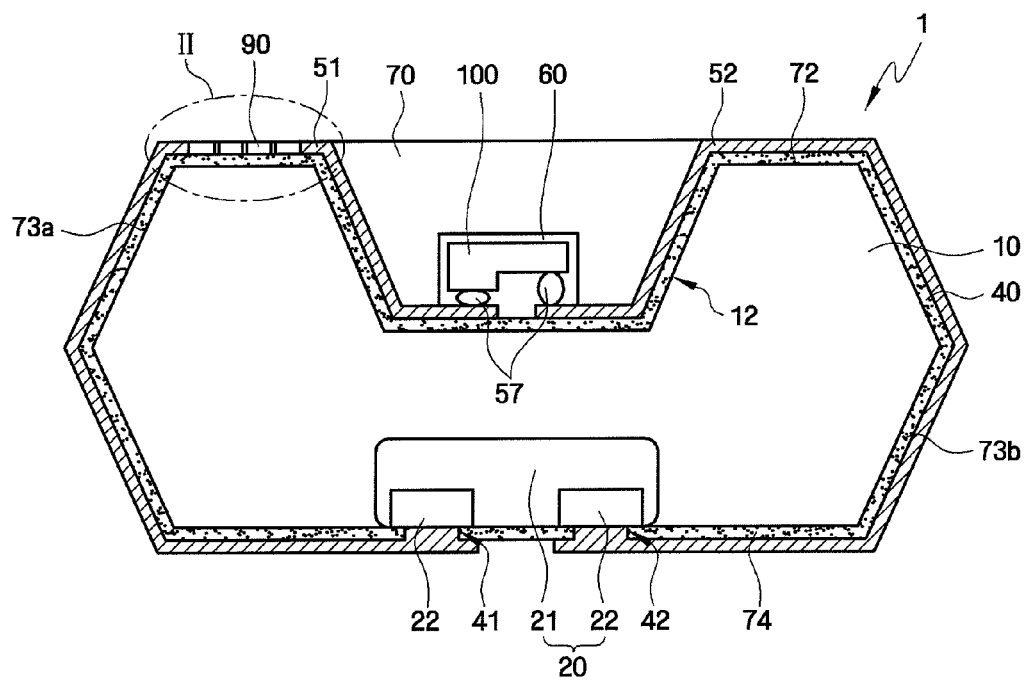
FIG. 1 is a cross-sectional view of a light emitting package according to a first embodiment of the present disclosure.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In addition, in the drawings, the thickness of layers and regions are exaggerated for clarity.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "below," "beneath," "lower," "above" or "upper" may be used herein to describe one element's relationship to other elements as illustrated in the Figures. It will be understood that relative terms are intended to encompass different orientations of the device in addition to the orientation depicted in the Figures.

Exemplary embodiments of the present disclosure are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing.

Figure 2:
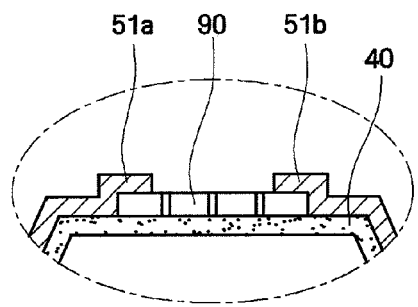
FIG. 2 is an enlarged cross-sectional view of a region (II) of FIG. 1.
Figure 3:
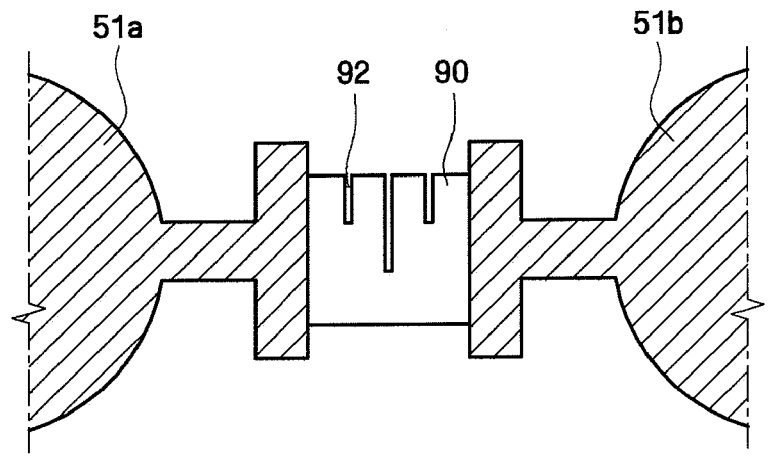
FIG. 3 is an enlarged plan view of a region (II) of FIG. 1.

Hereinafter, embodiments of the present disclosure will be described in detail with reference to the accompanying drawings. FIGS. 1 through 3 illustrate a light emitting package according to a first embodiment of the present disclosure. In detail, FIG. 1 is a cross-sectional view of a light emitting package according to a first embodiment of the present disclosure, FIG. 2 is an enlarged cross-sectional view of a region (II) of FIG. 1, and FIG. 3 is an enlarged plan view of a region (II) of FIG. 1.

Referring first to FIG. 1, a light emitting package 1 according to the first embodiment may include a package body 10, a zener diode 20, a protective layer 40, a first electrode 51, a second electrode 52, a phosphor layer 60, a resin layer 70, a thin film resistor 90, and a light emitting element 100.

In detail, the package body 10 may include, for example, Si, strained Si, Si alloy, SOI (Silicon-On-Insulator), SiC, SiGe, SiGeC, Ge, Ge alloy, GaAs, InAs, AlN, Cs, one of polyimides, composites of these materials, and combinations thereof, but is not limited thereto. In addition, the package body 10 may be an undoped substrate, but aspects of the present invention are not limited thereto.

A groove 12 may be formed on a first surface 72 of the package body 10. The light emitting element 100 may be disposed within the groove 12, which is larger than the light emitting element 100. The size of the groove 12 may depend on the extent in which the light generated from the light emitting element 100 is reflected to the sidewall of the groove 12, the angle of reflection, the kind of the resin layer 70 filling the groove 12, the kind of the phosphor layer 60, and so forth. In addition, the light emitting element 100 may be placed at substantially the center of the groove 12. When a distance between the light emitting element 100 and the sidewall of the groove 12 is equally maintained, non-uniformity in the chromaticity can be easily avoided.

When an over-voltage is applied to the light emitting element 100 due to static electricity, the zener diode 20 may form a by-pass current to prevent the light emitting element 100 from being damaged.

The zener diode 20 may be provided in the package body 10, specifically on a second surface 74 of the package body 10.

In addition, the zener diode 20 may include a first impurity region 21 of a first conductivity type (for example, a p type), and a second impurity region 22 of a second conductivity type (for example, an n type). Here, the second impurity region 22 is in contact with the first impurity region 21. In one embodiment, there may be two second impurity regions 22 as shown in FIG. 1. As illustrated, when there are two second impurity regions 22, they each may be electrically connected to and may overlap with one of the first electrode 51 and the second electrode 52, respectively.

If the zener diode 20 is formed by forming the first impurity region 21 and the second impurity region 22 in the undoped package body 10, like in the illustrated embodiment, doping concentrations of the first impurity region 21 and the second impurity region 22 can be easily adjusted. In such a case, the first impurity region 21 may be formed at a relatively low concentration, while the second impurity region 22 may be formed at a relatively high concentration. For example, the doping concentration of the first impurity region 21 may be not less than about $5 \times 10^{16}/cm^3$ and not greater than about $1 \times 10^{18}$ $cm^3$, and the doping concentration of the second impurity region 22 may be higher than that of the first impurity region 21.

The protective layer 40 may be formed along the first surface 72, the sidewalls 73a, 73b, and the second surface 74 of the package body 10. The protective layer 40 may be, for example, an oxide layer, a nitride layer, or an oxynitride layer. In one embodiment, holes 41 and 42 may be formed in the protective layer 40 to expose the second impurity region 22.

The first electrode 51 and the second electrode 52 may be disposed on the package body 10 to be spaced apart from each other. In one embodiment, the first electrode 51 may be formed along the bottom surface of the groove 12, the left sidewall of the groove 12, the first surface 72 of the package body 10, the left sidewall 73a of the package body 10 and the second surface 74 of the package body 10. The first electrode 51 may be electrically connected to part of the second impurity region 22 through the hole 41. Similarly, the second electrode 52 may be formed along the bottom surface of the groove 12, the right sidewall of the groove 12, the first surface 72 of the package body 10, the right sidewall 73b of the package body 10 and the second surface 74 of the package body 10. The second electrode 52 may be electrically connected to the other part of the second impurity region 22 through the hole 42.

The first electrode 51 and the second electrode 52 may be made of any suitable conductive material. In some embodiments, a highly conductive material may be preferred. The first electrode 51 and the second electrode 52 may be chosen from, for example, copper (Cu), aluminum (Al), silver (Ag), gold (Au), tungsten (W), platinum (Pt), tin (Ti), zinc (Zn), and nickel (Ni), composites of these materials, and stacks thereof, but not limited thereto.

In one embodiment, the light emitting element 100 disposed within the groove 12 may be an LED (Light Emitting Diode). Although not illustrated, the light emitting element 100 may include a first conductive layer of a first conductivity type (for example, a p type), a second conductive layer of a second conductivity type (for example, an n type), a light emitting layer disposed between the first conductive layer and the second conductive layer, a first chip electrode connected to the first conductive layer, and a second chip electrode connected to the second conductive layer. If a forward driving bias is applied to the light emitting element 100, carriers (that is, holes) of the first conductive layer are recombined with carriers (that is, electrons) of the second conductive layer in the light emitting layer, to then generate light. The first conductive layer, the second conductive layer, and the light emitting layer may be formed of $In_xAl_yGa_{(1-x-y)}N$ ($0 \leq x \leq 1$, $0 \leq y \leq 1$). The light emitting element 100 may operate by a driving bias applied between the first conductive layer and the second conductive layer. The absolute value of a difference between a first bias applied to the first conductive layer and a second bias applied to the second conductive layer corresponds to driving bias. The first bias may be transferred to the first conductive layer via the first electrode 51 and the first chip electrode and the second bias may be transferred to the second conductive layer via the second electrode 52 and the second chip electrode. Here, the driving bias may be DC power, but not limited thereto.

While the illustrated light emitting element 100 is a flip-chip type LED, aspects of the present invention are not limited thereto. The light emitting element 100 may be any suitable device known to one skilled in the art. For example, the light emitting element 100 may be a lateral type LED, or a vertical type LED. In the flip-chip type LED, first and second chip electrodes may be disposed to face a bottom surface of a package (in FIG. 1, in a downward direction, for example). In the lateral type LED, first and second chip electrodes may be disposed to face an upper surface of a package (in FIG. 1, in an upward direction, for example). In the vertical type LED, one of first and second chip electrodes may be disposed to face an upper surface of a package and the other may be disposed to face a bottom surface of the package.

In one embodiment, the light emitting element 100 may be coupled to the first and second electrodes 51, 52 via a conductive bump 57. One skilled in the art will appreciate that the light emitting element 100 may be electrically coupled to the first and second electrodes 51, 52 using any other suitable connection methods. Also, the light emitting element may be directly coupled to the first and/or second electrodes 51, 52.

The phosphor layer 60 may be formed on the light emitting element 100 and the resin layer 70 may be formed on the phosphor layer 60 to fill the groove 12, but aspects of the present invention are not limited thereto. For example, a resin layer may be formed on the light emitting element 100 to fill at least a portion of the groove 12 and a phosphor layer may be formed on the resin layer.

In detail, the phosphor layer 60 may be a mixture of a transparent resin and phosphor, but aspects of the present invention are not limited thereto. For example, the phosphor layer 60 may include only a phosphor without a transparent resin.

The phosphor will now be described in more detail. The phosphor absorbs light emitted from the light emitting element 100 with a particular wavelength and converts it into light with a different wavelength. That is to say, the phosphor may be a substance that absorbs the light primarily emitted from the light emitting element 100 and then secondarily emits the absorbed light.

Use of the phosphor allows a light emitting device to provide various colors. For white color rendering, the following method may be used. If the light emitting element 100 emits light with a blue wavelength (In this case, the light emitting element 100 is to be referred to as a blue-light emitting device.), the phosphor layer 60 may include a yellow phosphor that converts the wavelength of some of the blue light to generate yellow light, and a red phosphor that converts the wavelength of some of the blue light to generate red light. Alternatively, the phosphor layer 60 may also include a green phosphor that converts the wavelength of some of the blue light to generate green light, and a red phosphor that converts the wavelength of some of the blue light to generate red light. In other words, when the light emitting device element 100 is a blue LED, white light is produced by mixing the light generated based on the primary emission by the light emitting device element 100 and the light based on the secondary emission by the phosphors.

If the light emitting element 100 emits light with an ultraviolet (UV) wavelength (In this case, the light emitting element 100 is to be referred to as a UV LED.), the phosphor layer 60 may include red, green, and blue (RGB) phosphors.

For example, the phosphors may be chosen from a nitride-based/oxynitride-based phosphor, mainly activated by lanthanoids such as Eu and Ce; an alkaline earth halogen apatite phosphor, an alkaline earth metal borate halogen phosphor, an alkaline earth metal aluminate phosphor, an alkaline earth silicate phosphor, an alkaline earth sulfide phosphor, an alkaline earth thiogallate phosphor, a thiosilicate phosphor, an alkaline earth silicon nitride phosphor, a germinate phosphor, and a rare earth aluminate phosphor, mainly activated by lanthanoids such as Ce; a rare earth silicate phosphor, an organic material or organic complex, mainly activated by lanthanoids such as Ce.

The resin layer 70 may be formed of any material without any particular limitation as long as it can fill the groove 12 of the package body 10. Examples of the resin layer 70 may include epoxy resin, silicon resin, hard silicon resin, modified silicon resin, urethane resin, oxetane resin, acryl resin, polycarbonate resin, and polyimide resin.

The thin film resistor 90 is formed on the package body 10 and is series-connected to the first electrode 51. In detail, as shown in FIGS. 2 and 3, the first electrode 51 may include a first conductive pattern 51a and a second conductive pattern 51b spaced apart from each other. The thin film resistor 90 is disposed between the first conductive pattern 51a and the second conductive pattern 51b. The first conductive pattern 51a may be disposed to overlap a portion of the thin film resistor 90 (a left portion of FIG. 2) and the second conductive pattern 51b may be disposed to overlap another portion of the thin film resistor 90 (a right portion of FIG. 2). In this way, the thin film resistor 90 may be electrically connected to the first conductive pattern 51a and the second conductive pattern 51b.

The thin film resistor 90 may be formed on the first surface 72 of the package body 10, but aspects of the present invention are not limited thereto.

In addition, the thin film resistor 90 may be made of, for example, a material having a higher resistance level than that of the first electrode 51, but aspects of the present invention are not limited thereto.

Further, while the illustrated thin film resistor 90 is series-connected to the first electrode 51, but aspects of the present invention are not limited thereto. For example, the thin film resistor 90 may be series-connected to the second electrode 52.

In particular, the color temperature of the light generated from the light emitting package 1 can be controlled by adjusting the resistance level of the thin film resistor 90, which will now be described in more detail.

As described above, the light emitting element 100 may operate by the driving bias applied between the first conductive layer and the second conductive layer. The absolute value of a difference between a first bias applied to the first conductive layer and a second bias applied to the second conductive layer corresponds to the driving bias. The first bias may be transferred to the first conductive layer via the first electrode 51 and the first chip electrode, while the second bias may be transferred to the second conductive layer via the second electrode 52 and the second chip electrode.

Since the thin film resistor 90 is series-connected to the first electrode 51, the resistance level of the first bias can be controlled by adjusting the resistance level of the thin film resistor 90. In such a case, the level of the driving bias is also adjusted. Accordingly, the level of the light generated from the light emitting element 100 is also adjusted.

The resistance level of the thin film resistor 90 may be controlled by, for example, laser trimming. That is to say, the thin film resistor 90 having a substantially rectangular shape is subjected to laser trimming, thereby partially removing the thin film resistor 90 to form recesses 92, as shown in FIG. 3. If the size of the thin film resistor 90 is reduced in this way, the resistance level of the thin film resistor 90 increases. Other methods of adjusting the resistance level of the thin film resistor 90 may be used.

For example, assumptions are made that the light emitting element 100 is a blue LED, the phosphor layer 60 includes a red phosphor that converts a wavelength of some blue light to produce red light, and a yellow phosphor that converts a wavelength of some blue light to produce yellow light. Alternatively, a green phosphor that converts a wavelength of some blue light to produce green light may also be used instead of the yellow phosphor. In this case, when the resistance level of the thin film resistor 90 is at a first level (that is, when the level of the driving bias is a level 1_1, the light emitting package 1 produces bluish white light. When the resistance level of the thin film resistor 90 is at a second level, which is greater than the first level (that is, when the level of the driving bias is a level 2_1), the light emitting package 1 produces reddish white light. This is because the resistance level of the thin film resistor 90 is increased from the first level to the second level, the driving bias is reduced from the level 1_1 to the level 2_1 and the light emitting element 100 produces a small amount of blue light. Accordingly, the light emitting package 1 emits reddish white light, rather than bluish white light.

Now, a color temperature controlling method of the light emitting package 1 will be described with reference to FIGS. 4 and 5.

Figure 4:
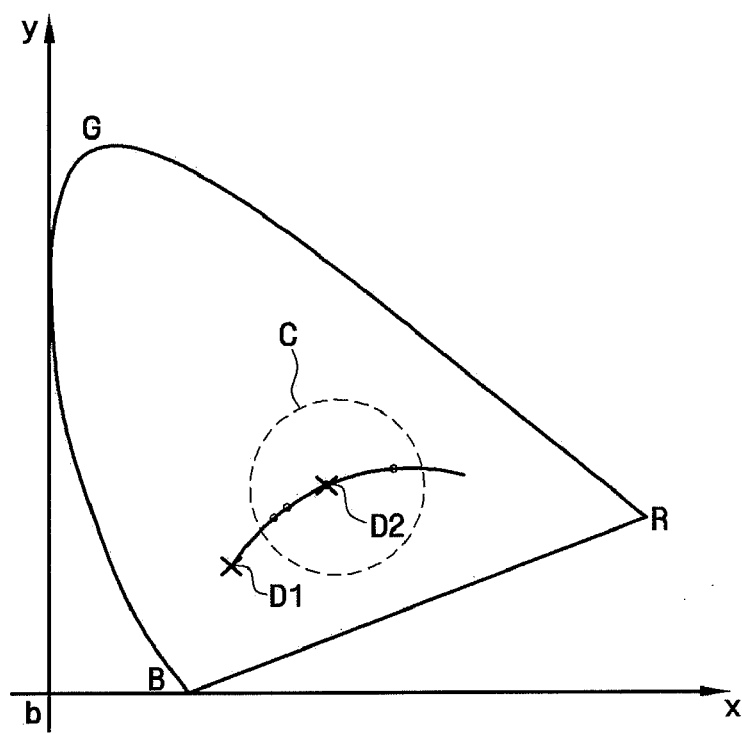
FIG. 4 is a color temperature graph for explaining a color temperature controlling method of the light emitting package according to the first embodiment of the present disclosure.

First, referring to FIG. 4, if the light emitted from the light emitting package 1 is near to a first position R in the color coordinate, the produced light is more like reddish light. If the light emitted from the light emitting package 1 is near to a second position G in the color coordinate, the produced light is more of a greenish light. If the light emitted from the light emitting package 1 is near to a third position B in the color coordinate, the produced light is more of a bluish light. In addition, it is assumed that when the color temperature of the light emitting package 1 falls under a range indicated by a dotted circle, labeled C in FIG. 4, the light emitting package 1 is determined to be a good product.

Figure 5:
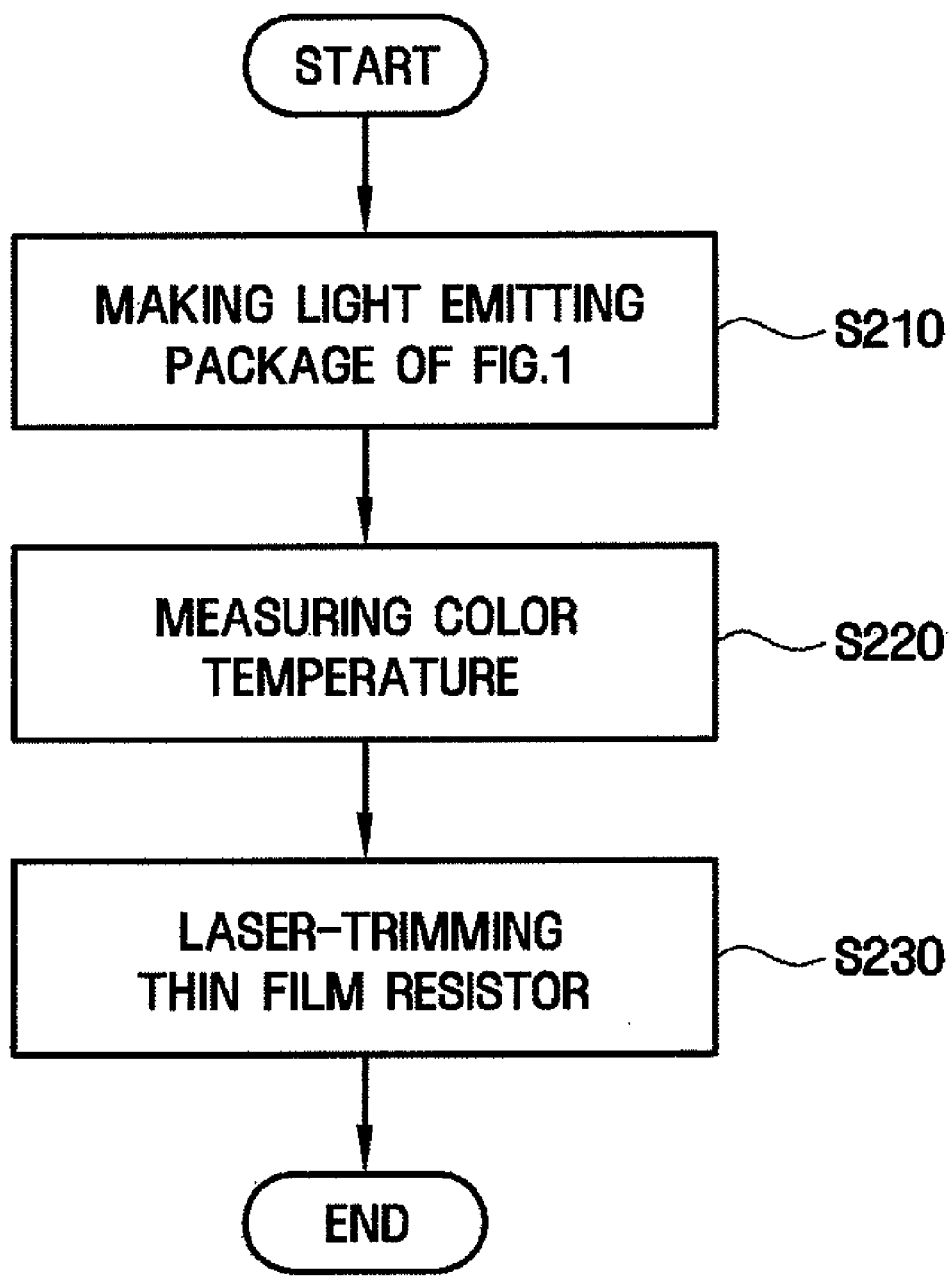
FIG. 5 is a flowchart illustrating the color temperature controlling method of the light emitting package according to the first embodiment of the present disclosure.

Referring to FIG. 5, the light emitting package 1 of FIG. 1 is initially made (S210). In detail, the light emitting package 1 is made to include the first electrode 51 and the second electrode 52, the light emitting element 100, and the thin film resistor 90 disposed on the package body 10 according to one embodiment of the present disclosure. The first electrode 51 and the second electrode 52 are spaced apart from each other. The light emitting element 100 are electrically connected to the first electrode 51 and the second electrode 52. Also, the thin film resistor 90 may be series-connected to the first electrode 51.

Next, based on the measuring result, the thin film resistor 90 is laser-trimmed to adjust the color temperature of the light emitting package 1 (S230).

In detail, even if the color temperature of the light emitting package 1 is at a fourth position D1 at the first measurement of color temperature, the color temperature of the light emitting package 1 can be shifted to a fifth position within the circle C. That is to say, even if the color temperature of the manufactured light emitting package 1 does not fall within the circle C representing the color temperature range in which the light emitting package 1 is determined as a good product, the color temperature of the light emitting package 1 is changed in a subsequent step (for example, laser trimming) to make the light emitting package 1 as a good product, thereby increasing the throughput of the light emitting package 1.

Figure 6:
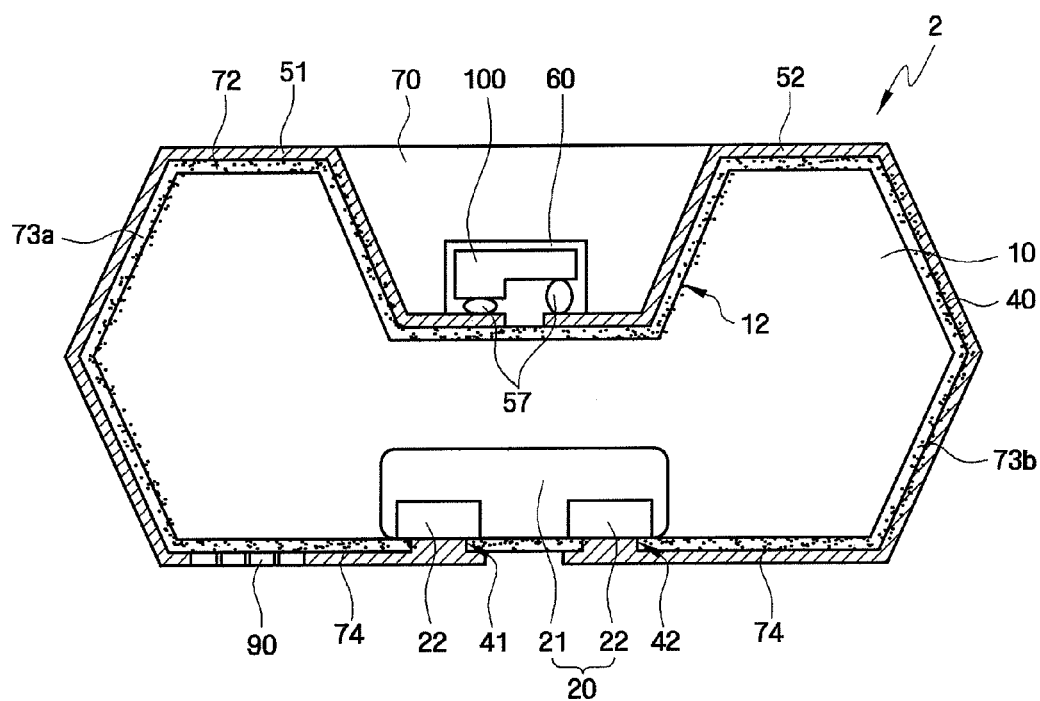
FIG. 6 is a cross-sectional view of a light emitting package according to a second embodiment of the present disclosure.

FIG. 6 is a cross-sectional view of a light emitting package according to a second embodiment of the present invention.

Referring to FIG. 6, the light emitting package 2 according to a second embodiment of the present invention is different from the light emitting package 1 according to the first embodiment of the present invention in that the thin film resistor 90 is formed on a second surface 74, not the first surface 72, of the package body 10.

Figure 7:
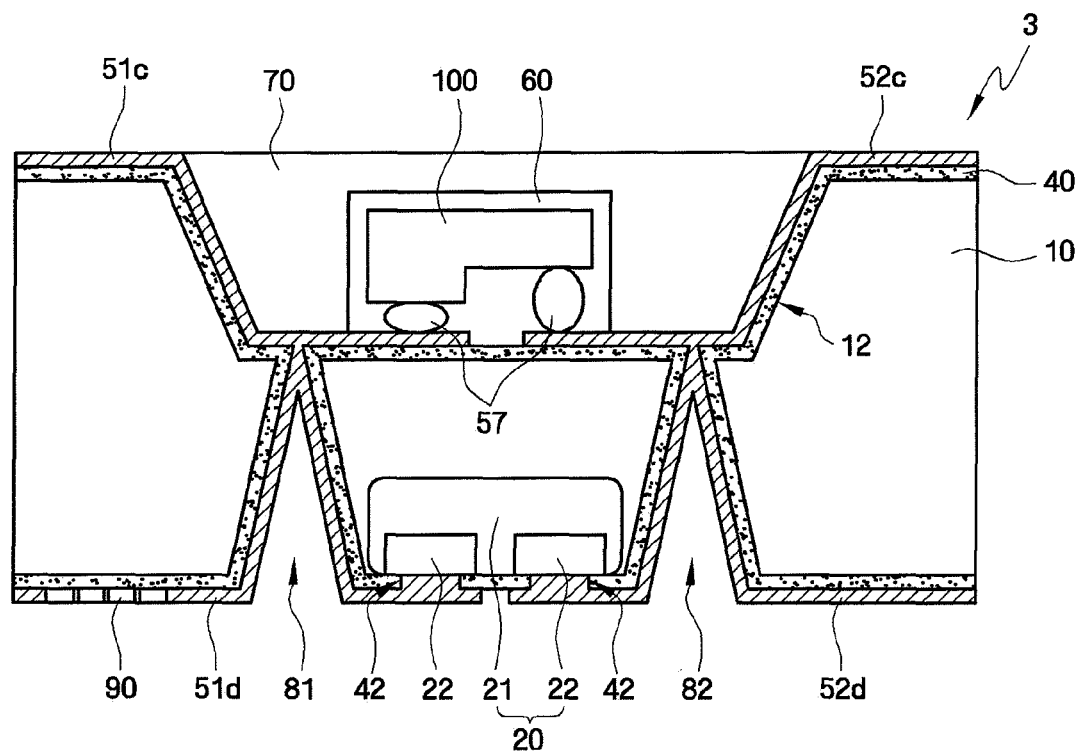
FIG. 7 is a cross-sectional view of a light emitting package according to a third embodiment of the present disclosure.

FIG. 7 is a cross-sectional view of a light emitting package according to a third embodiment of the present invention.

Referring to FIG. 7, the light emitting package 3 according to the third embodiment of the present invention includes reverse V-shaped grooves 81 and 82 connecting the second surface 74 of the package body 10 to the groove 12.

The first electrodes 51c and 51d include a first first-surface electrode 51c and a first second-surface electrode 51d. In detail, the first first-surface electrode 51c is conformally formed from the first surface 72 of the package body 10 to the sidewall and bottom surface of the groove 12. The first second-surface electrode 51d is conformally formed from the second surface 74 of the package body 10 to the sidewall and bottom surface of the reverse V-shaped groove 81, so that it comes into contact with the first first-surface electrode 51c.

The second electrodes 52c and 52d include a second first-surface electrode 52c and a second second-surface electrode 52d. In detail, the second first-surface electrode 52c is conformally formed from the first surface 72 of the package body 10 to the sidewall and bottom surface of the groove 12. The second second-surface electrode 52d is conformally formed from the second surface 74 of the package body 10 to the sidewall and bottom surface of the reverse V-shaped groove 82, so that it comes into contact with the second first-surface electrode 52c.

The thin film resistor 90 is formed on the second surface 74 of the package body 10, and is series-connected to the first second-surface electrode 51d.

Figure 8:
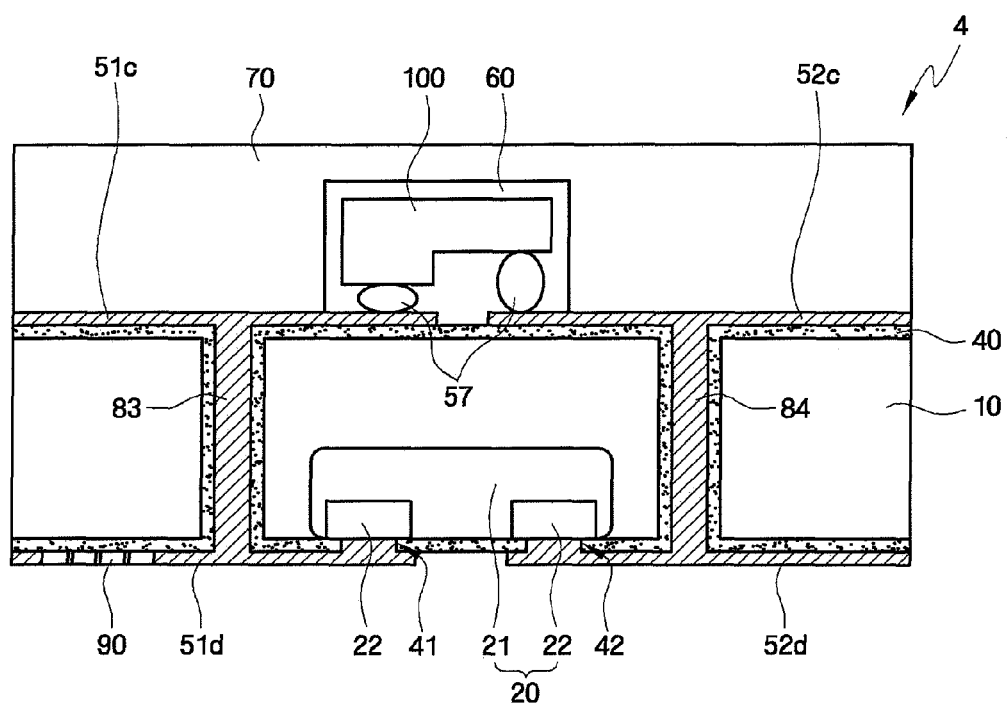
FIG. 8 is a cross-sectional view of a light emitting package according to a fourth embodiment of the present disclosure.

FIG. 8 is a cross-sectional view of a light emitting package according to a fourth embodiment of the present invention.

Referring to FIG. 8, the light emitting package 4 according to a fourth embodiment of the present invention is featured in that a light emitting element 100 is formed on the first surface 72 of the package body 10 without a groove formed on the package body 10. In addition, a first first-surface electrode 51c and a first second-surface electrode 51d are connected to each other by a first via 83 passing through the package body 10. A second first-surface electrode 52c and a second second-surface electrode 52d are connected to each other by a second via 84 passing through the package body 10. The thin film resistor 90 may be formed on the second surface 74 of the package body 10, and may be series-connected to the first second-surface electrode 51d.

Hereinafter, examples of light emitting system using other light emitting packages according to various embodiments of the present invention will be described.

Figure 9:
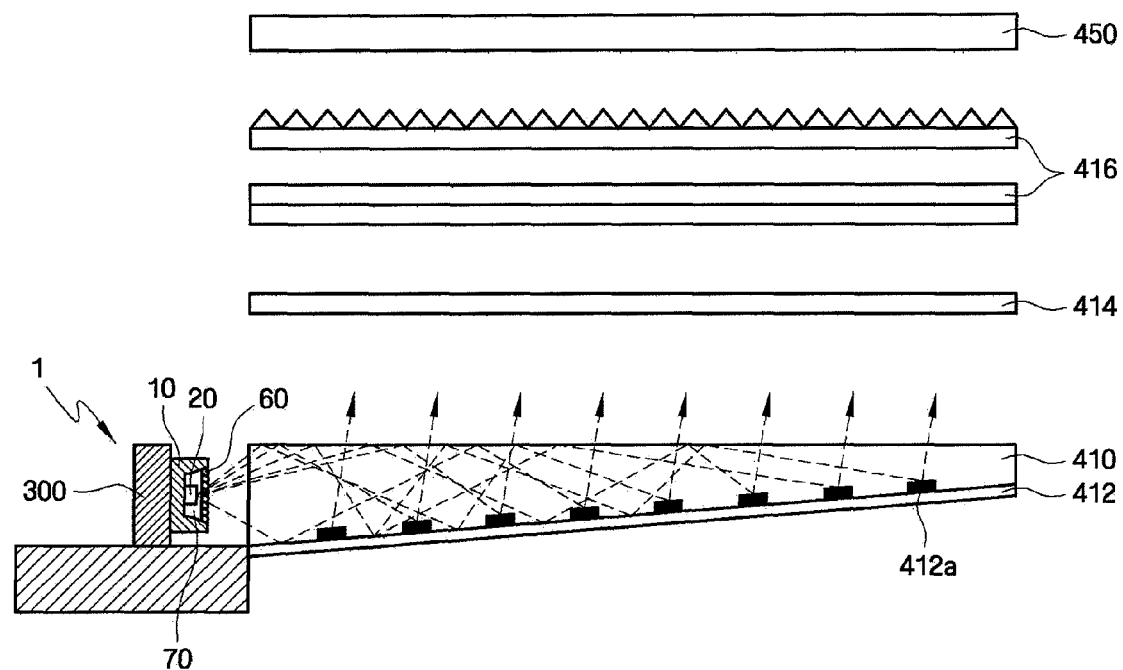
FIG. 9 illustrates an exemplary light emitting system according to a first embodiment of the present disclosure.

FIG. 9 illustrates an exemplary light emitting system according to a first embodiment of the present invention.

The light emitting system illustrated in FIG. 9 is an end product using the light emitting package 1 having the light emitting element 100 mounted thereon according to one embodiment of the present disclosure. The light emitting package 1 may be mounted on a circuit board 300. The light emitting device according to the example embodiments discussed above can be applied to various devices including, for example, illuminating devices, displays, and mobile devices such as mobile phones, MP3 players, and navigation systems. The end product shown in FIG. 9 is an edge-type back light unit (BLU) for use in a liquid crystal display (LCD). Since an LCD is not a self-emissive display device, a BLU is used as a light source for the LCD and illuminates an LCD panel from the back. The light emitting package 1 may be used in an LED TV or 3D TV.

Referring to FIG. 9, the BLU includes a light emitting package 1, a light guide plate 410, a reflection sheet 412, a diffusion sheet 414, and a pair of prism sheets 416.

The light emitting package 1 serves as a light source to provide light. Here, the light emitting package 1 may be of a side-view type. As described above, the light emitting package 1 can adjust the color temperature of white light by adjusting the level of the driving bias. When the color temperature of white light produced from the light emitting package 1 used as the BLU is controlled in the above-described manner, a certain mood of images or an image feel displayed on an LCD panel 450 can be created in a user's desired manner.

The light guide plate 410 guides light provided to the LCD panel 450. The light guide plate 410 is a panel made of a transparent plastic material such as acryl and allows light generated by the light emitting package 1 to propagate toward the LCD panel 450 disposed thereon. Thus, the light guide plate 410 has various patterns 412a printed on its rear surface so as to change a propagation direction of incident light toward the LCD panel 450.

The reflection sheet 412 is disposed on a bottom surface of the light guide plate 410 and reflects upward light escaping from the bottom surface of the light guide plate 410. That is, the reflection sheet 412 reflects light not reflected by the various patterns 412a back toward an exit surface of the light guide plate 410. With this configuration, light loss can be reduced and the uniformity of light transmitted through the exit surface of the light guide plate 410 can also be improved.

The diffusion sheet 414 disperses light exiting the light guide plate 410, thereby preventing a partial concentration of light.

Each of the pair of prism sheets 416 has a plurality of triangular prisms periodically arranged on a top surface thereof. The pair of prism sheets 416 may include two sheets with the plurality of triangular prisms arranged in a staggered fashion so that light diffused by the diffusion sheet 414 propagates perpendicular to the LCD panel 450.

FIGS. 10 through 13 illustrate examples of light emitting system according to second to fifth embodiments of the present invention.

Figure 10:
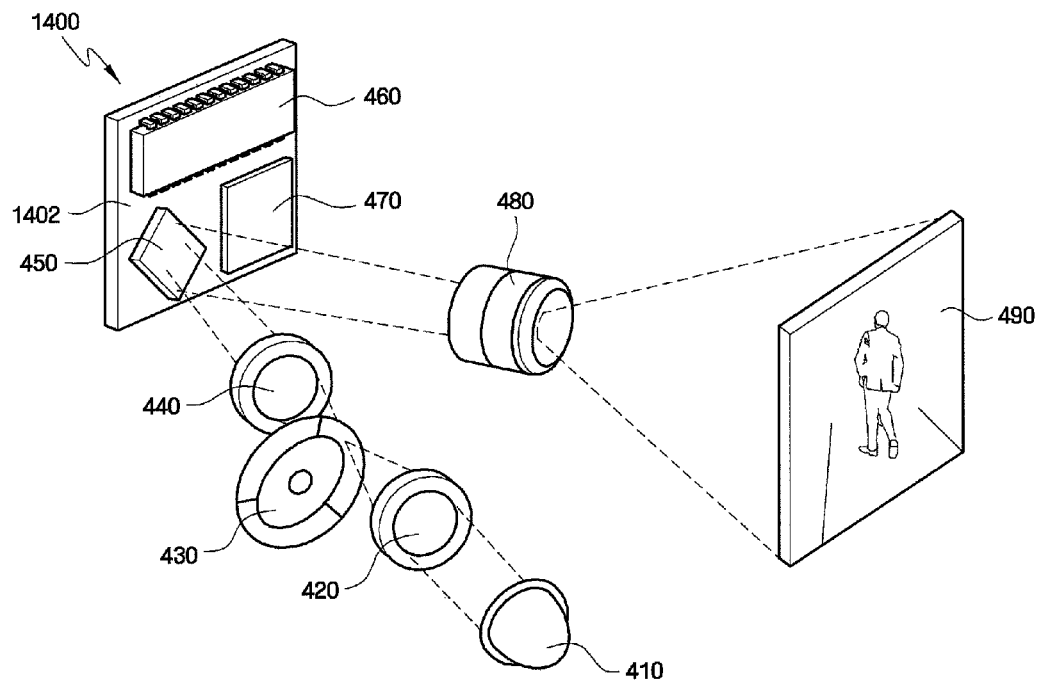
FIGS. 10 through 13 illustrate exemplary light emitting systems according to second to fifteenth embodiments of the present disclosure.
Figure 11:
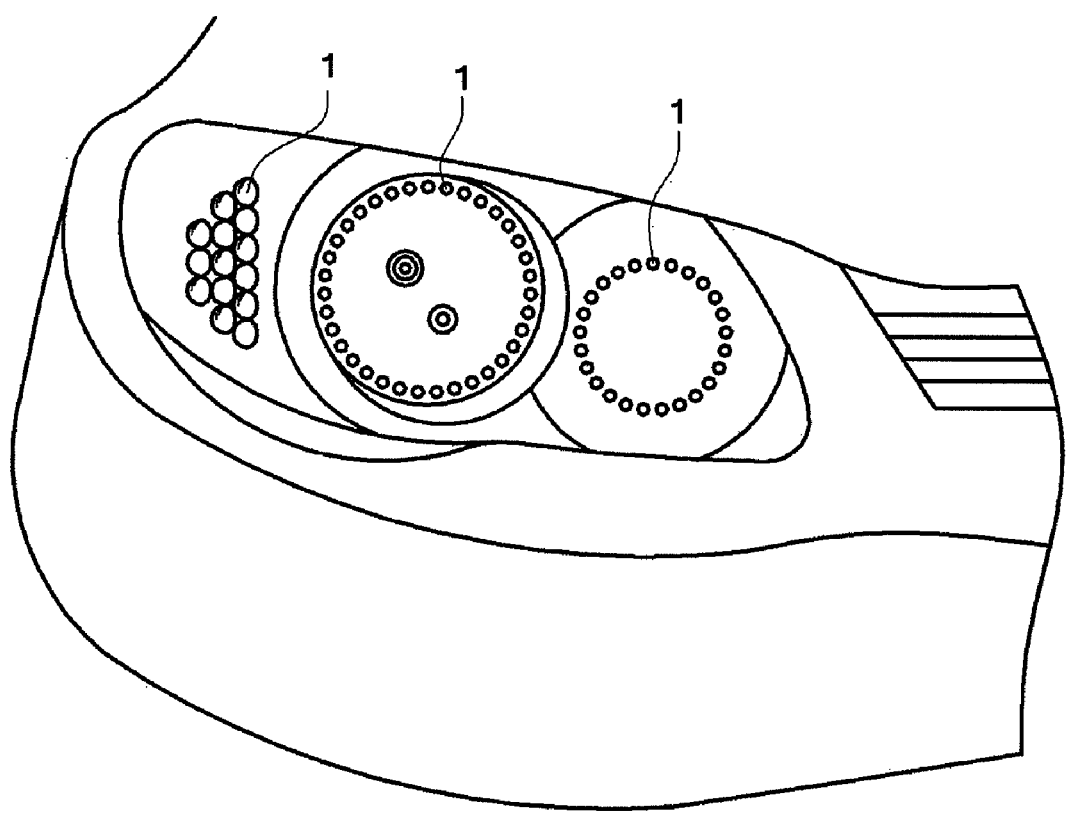
Figure 12:
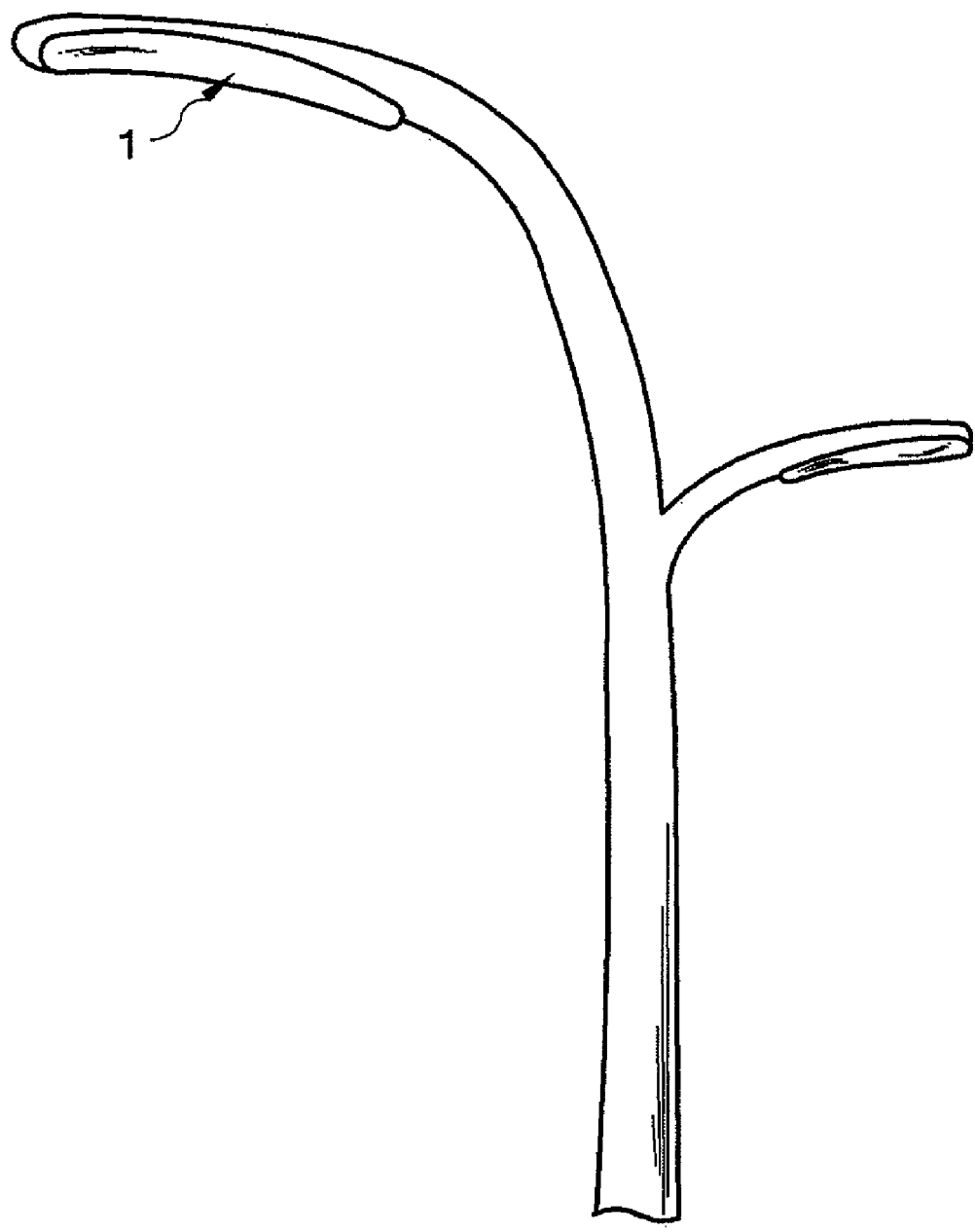
Figure 13:
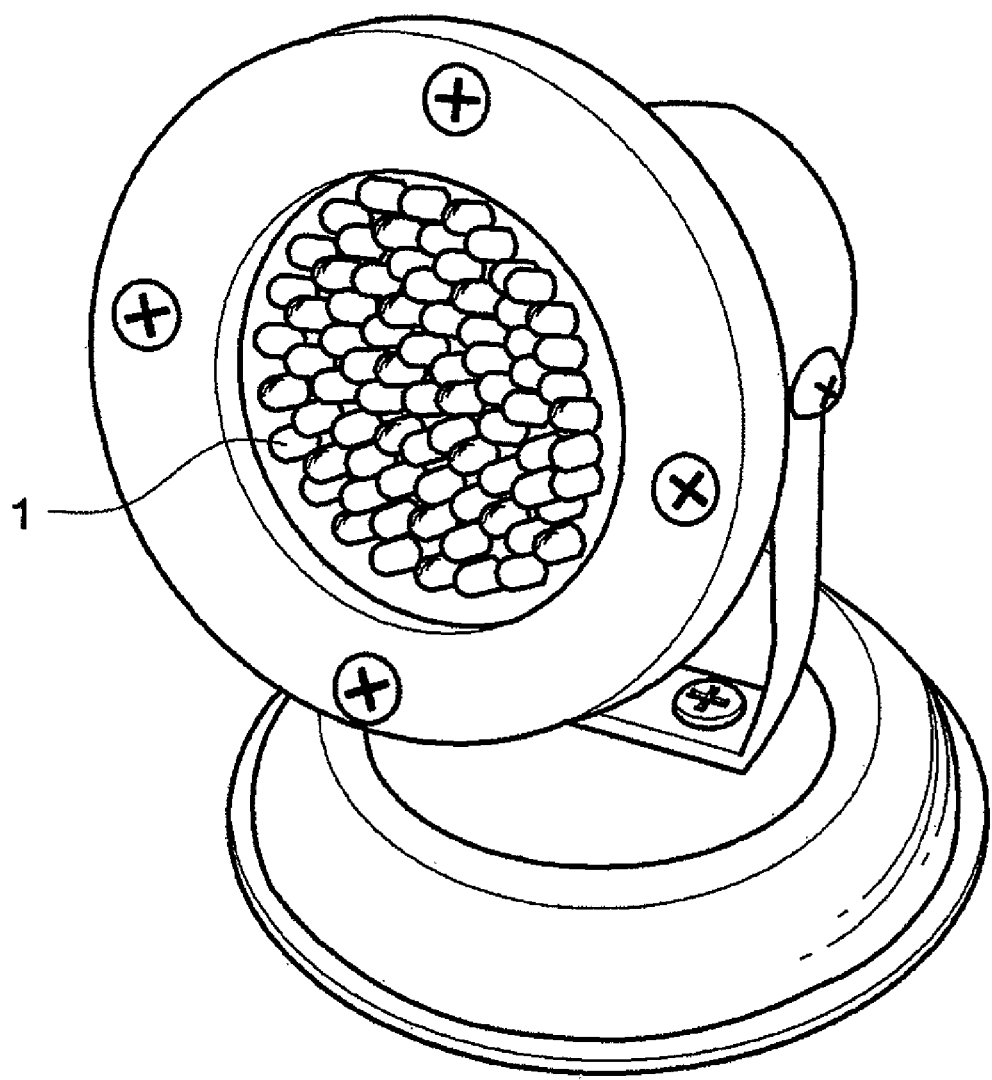

FIG. 10 illustrates a projector 1400, FIG. 11 illustrates a car headlight, FIG. 12 illustrates a street lamp, and FIG. 13 illustrates an illuminating lamp. The light emitting packages 1 shown in FIGS. 10 through 13 may be of a top-view type.

Referring to FIG. 10, light emitted from a light source 1410 passes through a condensing lens 1420, a color filter 1430, a sharping lens 1440, is reflected by a digital micromirror device (DMD) 1450, and passes through a projection lens 1480 for projection onto a screen 1490. The projector 1400 may include a processor 1470 and a graphics controller 1460 or other suitable semiconductor devices for the projector mounted on a circuit board 1400. The light emitting element or package according to example embodiments of the present invention is disposed within the light source 1410.

Hereinafter, the light emitting package 1 according to the first embodiment of the present invention will be described with reference to FIGS. 14 through 20 together with FIG. 1.

FIGS. 14 through 20 illustrate process steps for explaining a fabricating method of the light emitting package according to the first embodiment of the present invention. Here, FIG. 16B is a cross-sectional view taken along line 16A-16A' of FIG. 16A.

Figure 14:
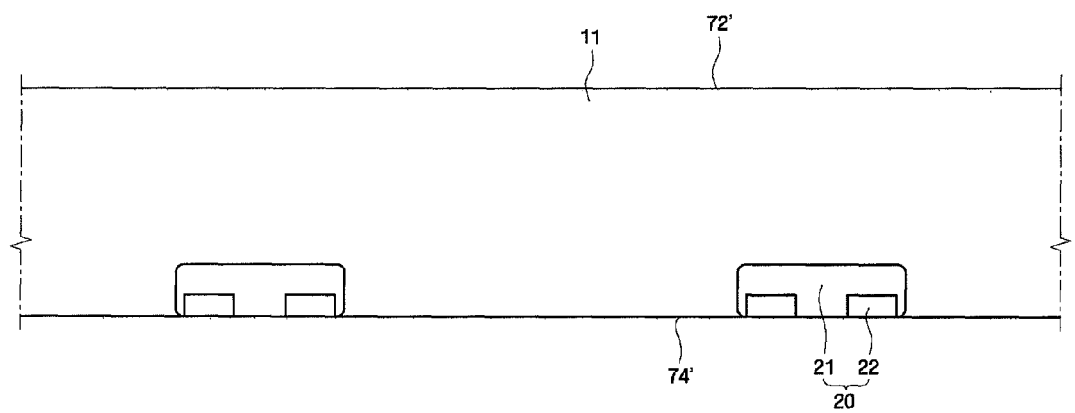
FIGS. 14 through 20 illustrate intermediate process steps for explaining a fabricating method of the light emitting package according to the first embodiment of the present disclosure.

Referring to FIG. 14, first conductivity type impurities are implanted into a substrate 11 by, for example, ion implantation, thermal diffusion, or plasma doping, to form the first impurity region 21. Next, second conductivity type impurities are implanted so as to come into contact with the first impurity region 21 by, for example, ion implantation, thermal diffusion, or plasma doping, to form the second impurity region 22. The first impurity region 21 and the second impurity region 22 form a p-n junction, constituting the zener diode 20.

Figure 15:
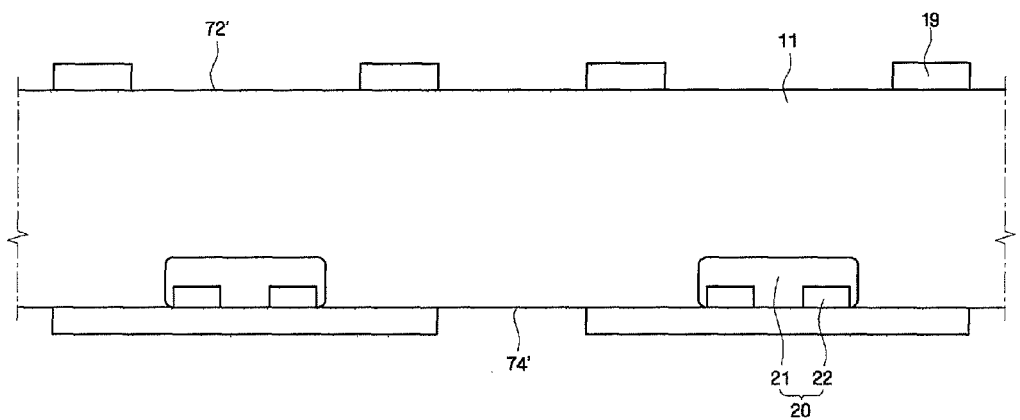

Referring to FIG. 15, a mask 19 is formed on first and second surfaces 72', 74' of the substrate 11. The mask 19 may be formed of, for example, a silicon nitride layer, and a silicon oxide layer.

Figure 16A:
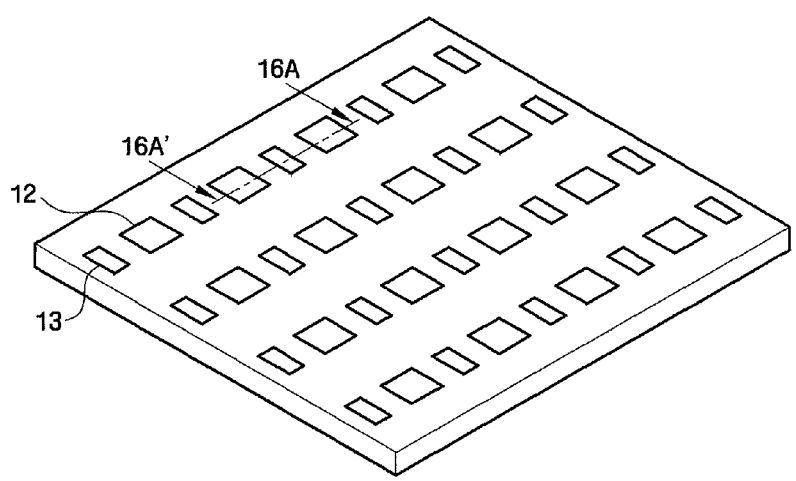
Figure 16B:
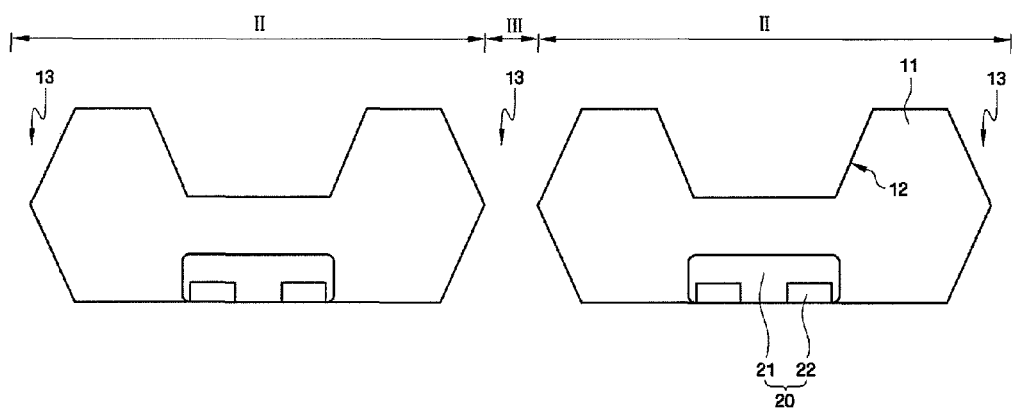

Referring to FIGS. 16A and 16B, the substrate 11 is etched using the mask 19.

The etching may be, for example, wet etching using KOH. A groove 12 and a through-hole 13 are formed in a mounting region (II) and an isolation area (III) of the first surface 72' of the substrate 11, respectively.

Shapes of the groove 12 and the through-hole 13 may be determined by adjusting an exposure time of the substrate 10 to etchants such as KOH. For example, the groove 12 may be formed to have slanted sidewalls. That is to say, the groove 12 may be formed such that it has a width tapering from the first surface 72' of the substrate 11 to the central portion. In addition, the through-hole 13 may be formed such that it has a width tapering from the second surface 74' of the substrate 11 to the central portion.

Like in the illustrated embodiment, a single groove 12 may be provided in the mounting region (II). A single through-hole 13 may also be provided between two adjacent mounting regions (II), but aspects of the present invention are not limited thereto.

Figure 17:
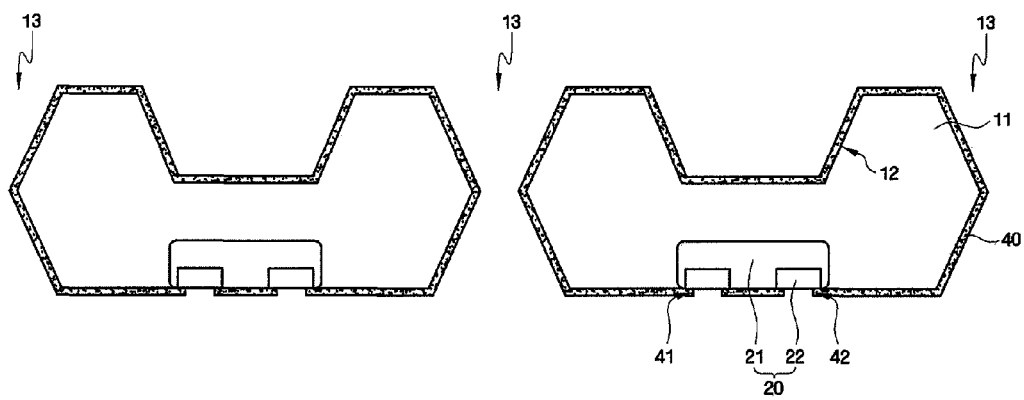

Referring to FIG. 17, the protective layer 40 may be consecutively formed along the first and second surfaces 72', 74' of the substrate 11, the sidewalls and bottom surface of the groove 12, and sidewalls of the through-hole 13. The protective layer 40 may be formed by, for example, thermal oxidation.

Figure 18:
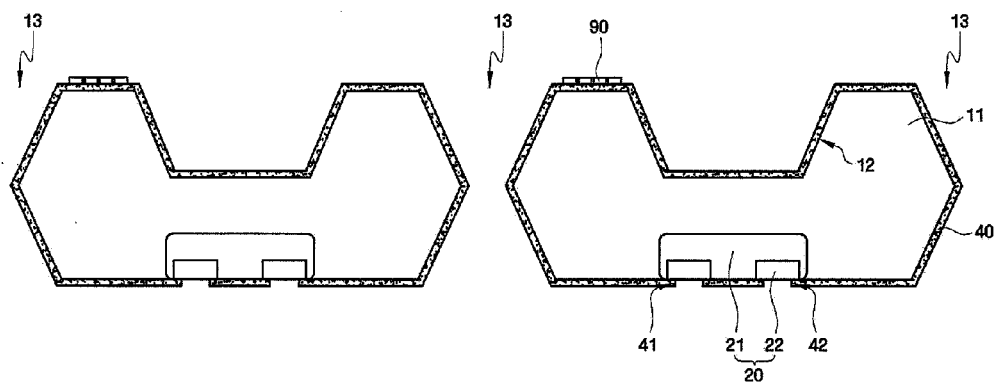

Referring to FIG. 18, the thin film resistor 90 may be formed on the first surface 72' of the substrate 11 by, for example, sputtering, electron-beam deposition, or stencil printing, but aspects of the present invention are not limited thereto.

The thin film resistor 90 may have a substantially rectangular shape, as described above, but aspects of the present invention are not limited thereto.

Figure 19:
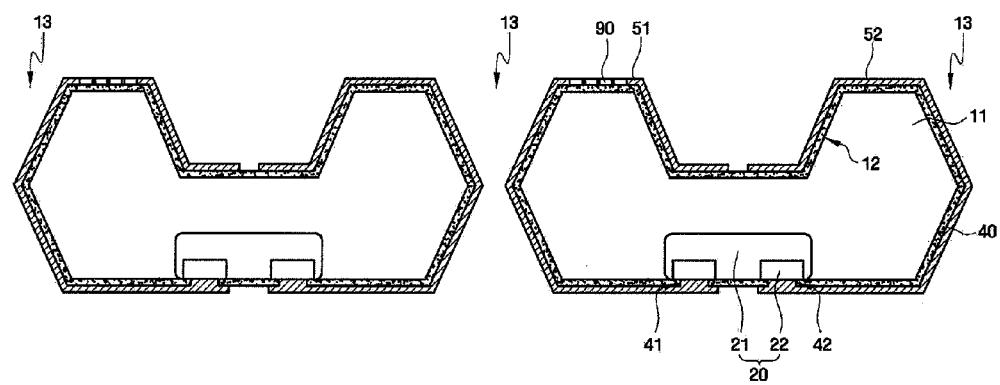
Figure 20:
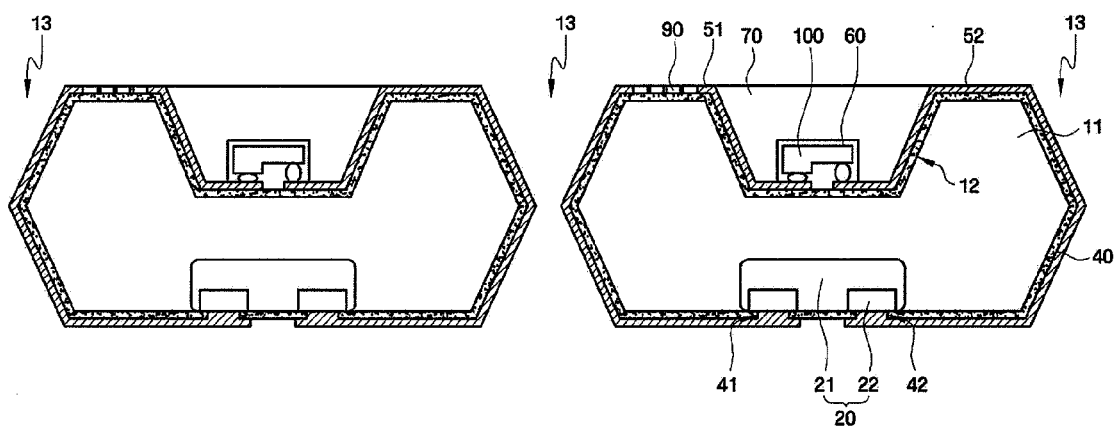

Referring to FIG. 19, the first electrode 51 and the second electrode 52 are formed on the substrate 11 to be spaced apart from each other. The first electrode 51 is consecutively formed along the bottom surface of the groove 12, the left sidewall of the groove 12, and the second surface 74' of the substrate 11. The first electrode 51 may be electrically connected to part of the second impurity region 22 through the hole 41. Here, the first electrode 51 may be series-connected to the thin film resistor 90. Similarly, the second electrode 52 is consecutively formed along the bottom surface of the groove 12, the right sidewall of the groove 12, and the first surface 72' of the substrate 11. The second electrode 52 is electrically connected to the other part of the second impurity region 22 through the hole 42.

In detail, a conductive material is formed on the first surface 72' of the substrate 11 by sputtering or electroplating, followed by patterning. Next, a conductive material is formed on the second surface 74' of the substrate 11, followed by patterning. When the conductive material is formed on the second surface 74' of the substrate 11, the conductive materials formed on the first and second surfaces 72', 74' are connected to each other through the through-hole 13.

Referring back to FIG. 20, the light emitting element 100 electrically connected to the first electrode 51 and the second electrode 52 is formed on the substrate 11.

Next, the phosphor layer 60 is formed on the light emitting element 100.

Then, the resin layer 70 is formed on the phosphor layer 60 to fill the groove 12.

Next, the substrate 11 is cut in units of chip (that is, the isolation (III) of the substrate 11 is severed.) to form the light emitting package 1 show in FIG. 2. The light emitting package 1 includes the package body 10, the first electrode 51 and the second electrode 52 formed on the package body 10 to be spaced apart from each other, the light emitting element 100 electrically connected to the first electrode 51 and the second electrode 52 on the package body 10, and the thin film resistor 90 series-connected to the first electrode 51 on the package body 11.

Figure 21:
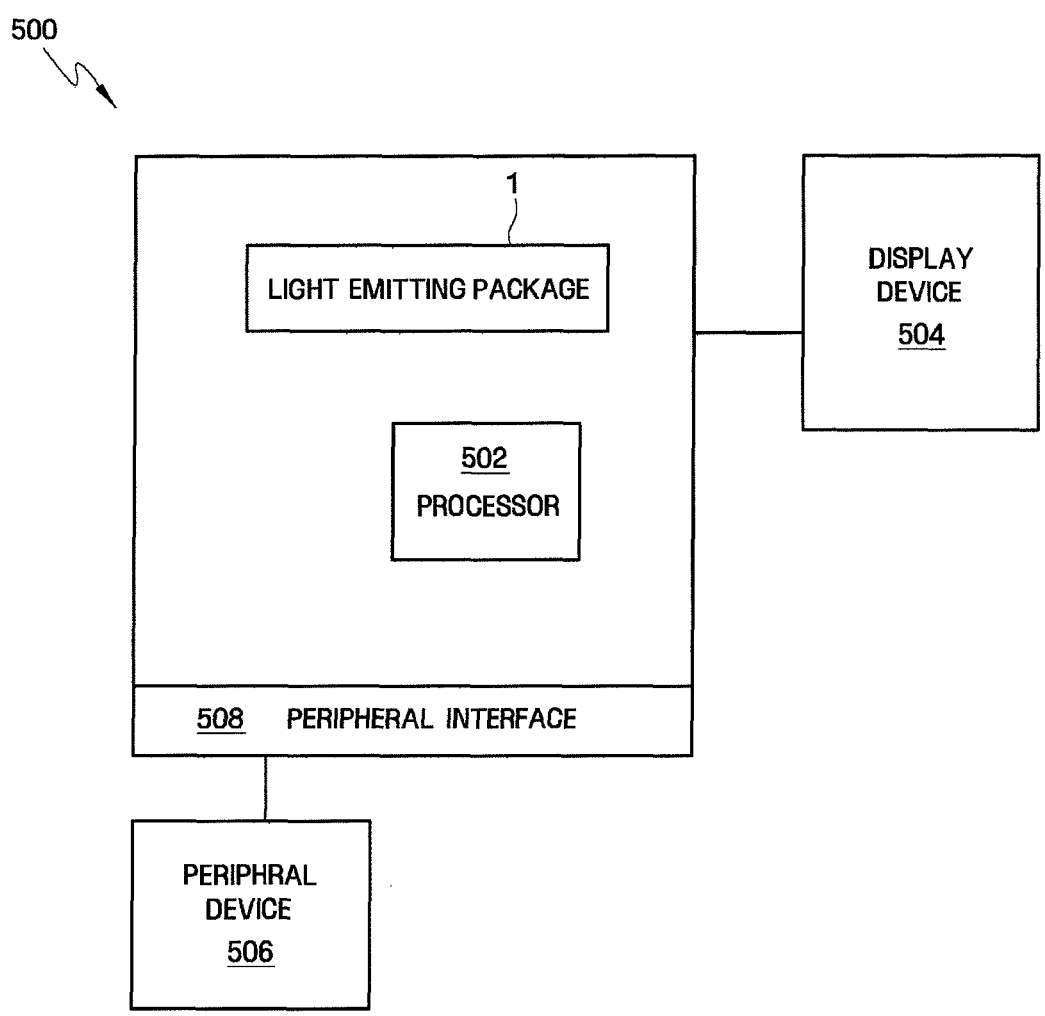
FIG. 21 illustrates a block diagram of a system in accordance with some embodiments of the present disclosure.

FIG. 21 illustrates a block diagram of a system in accordance with various embodiments of the present disclosure. A system 500 may, for example, include a processor 502 and a display device 504. The processor 502 may facilitate the use of the system 500 and interact with the display device 504. The system 500 may also optionally include a peripheral device 506 such as a keyboard, joystick and mouse. The system 500 may include a peripheral interface 508 coupled to the peripheral device 506. Thus, the system 500 may be implemented as a portable or non-portable electronic device such as a personal computer including, for instance, a tablet PC, a laptop computer, a personal media player, MP3 player, a game console, a telecommunication device such as a cell phone, or any other electronic device. The system 500 may also be a part of a digital television. In one embodiment, the display device 504 may include one or more light emitting packages as described above.

While the present invention has been described in connection with the fabricating method of the light emitting element 100 by way of example, it will be apparent to those skilled in the art that fabricating methods of the light emitting devices 2 through 4 according to the second through fourth embodiments may be derived from the fabricating method of the light emitting device 1 according to the first embodiment of the invention.

Although the present invention has been described in connection with the exemplary embodiments of the present invention with reference to the accompanying drawings, it will be apparent to those skilled in the art that various modifications and changes may be made thereto without departing from the scope and spirit of the invention. Therefore, it should be understood that the above embodiments are not limitative, but illustrative in all aspects.

What is claimed is:

1. A light emitting package comprising:
   a package body having a first surface and a second surface opposite to the first surface;
   a first electrode and a second electrode formed on the package body and spaced apart from each other;
   a light emitting element formed on the package body and electrically connected to the first electrode and the second electrode; and
   a thin film resistor series-connected to the first electrode, wherein a resistance level of the thin film resistor is configured to be adjusted, and wherein when the resistance level of the thin film resistor is at a first level, the light emitting package is configured to produce bluish white light; and when the resistance level of the thin film resistor is at a second level greater than the first level, the light emitting package is configured to produce reddish white light.

2. The light emitting package of claim 1, wherein the first electrode includes a first conductive pattern and a second conductive pattern spaced apart from each other, and the thin film resistor is electrically connected to the first conductive pattern and the second conductive pattern.

3. The light emitting package of claim 1, wherein the thin film resistor is configured to be adjusted by laser trimming.

4. The light emitting package of claim 1, wherein the light emitting element is disposed on the first surface of the package body, and the thin film resistor is disposed on the first surface or second surface of the package body.

5. The light emitting package of claim 1, wherein a zener diode is provided on the second surface of the package body, and the first electrode and the second electrode are electrically connected to the zener diode.

6. The light emitting package of claim 1, wherein a first groove is formed on the first surface of the package body, and the light emitting element is disposed within the groove.

7. The light emitting package of claim 6, wherein a second groove is formed on the second surface of the package body, the second groove connecting the second surface of the package body to the first groove.

8. The light emitting package of claim 1, wherein the first electrode is formed along the first surface and a left sidewall and the second surface of the package body, and the second electrode is formed along the first surface, a right sidewall and the second surface of the package body.

9. The light emitting package of claim 1, wherein the first electrode is formed on both the first surface and the second surface of the package body, and a portion of the first electrode formed on the first surface and another portion of the first electrode formed on the second surface are connected to each other through a first via passing through the package body; and
   the second electrode is formed on both the first surface and the second surface of the package body, and a portion of the second electrode formed on the first surface and another portion of the second electrode formed on the second surface are connected to each other through a second via passing through the package body.

* * * * *